(12) United States Patent
Lim et al.

(10) Patent No.: US 11,508,660 B2
(45) Date of Patent: Nov. 22, 2022

(54) MOLDED POWER DELIVERY INTERCONNECT MODULE FOR IMPROVED IMAX AND POWER INTEGRITY

(71) Applicant: Intel Corporation, Santa Clara, CA (US)

(72) Inventors: Seok Ling Lim, Kulim Kedah (MY); Bok Eng Cheah, Pinang (MY); Jenny Shio Yin Ong, Pinang (MY); Jackson Chung Peng Kong, Pinang (MY)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 17/089,745

(22) Filed: Nov. 5, 2020

(65) Prior Publication Data

US 2022/0077060 A1 Mar. 10, 2022

(30) Foreign Application Priority Data

Sep. 4, 2020 (MY) .............................. PI2020004591

(51) Int. Cl.
*H01L 23/528* (2006.01)
*H01L 21/768* (2006.01)
*H01L 21/56* (2006.01)
*H01L 25/065* (2006.01)
*H01L 23/31* (2006.01)
*H01L 23/538* (2006.01)
*H01L 23/50* (2006.01)

(52) U.S. Cl.
CPC ........ *H01L 23/5286* (2013.01); *H01L 21/565* (2013.01); *H01L 21/76802* (2013.01); *H01L 23/31* (2013.01); *H01L 23/50* (2013.01); *H01L 23/5385* (2013.01); *H01L 23/5386* (2013.01); *H01L 25/0657* (2013.01)

(58) Field of Classification Search
CPC ..... H01L 23/5286; H01L 23/31; H01L 23/50; H01L 23/5385; H01L 23/5386; H01L 25/0657
See application file for complete search history.

(56) References Cited

U.S. PATENT DOCUMENTS

| | | | | |
|---|---|---|---|---|
| 7,081,650 B2 * | 7/2006 | Palanduz | ................ | H01L 24/17 257/E23.079 |
| 2004/0264103 A1 * | 12/2004 | Otsuka | .................... | H01L 23/50 257/E23.079 |
| 2006/0138647 A1 * | 6/2006 | Crisp | ...................... | H01L 24/73 257/723 |
| 2015/0070863 A1 * | 3/2015 | Yun | ........................ | H05K 1/162 361/767 |

* cited by examiner

*Primary Examiner* — Peniel M Gumedzoe
(74) *Attorney, Agent, or Firm* — Viering, Jentschura & PartnermbB

(57) ABSTRACT

A semiconductor package including a molded power delivery module arranged between a package substrate and a semiconductor chip and including a plurality of input conductive structures and a plurality of reference conductive structures, wherein the input conductive structures alternate between the plurality of reference conductive structures, wherein the input conductive structure is electrically coupled with a chip input voltage terminal and a package input voltage terminal, wherein each of the plurality of reference conductive structures are electrically coupled with a semiconductor chip reference terminal and a package reference terminal.

17 Claims, 14 Drawing Sheets

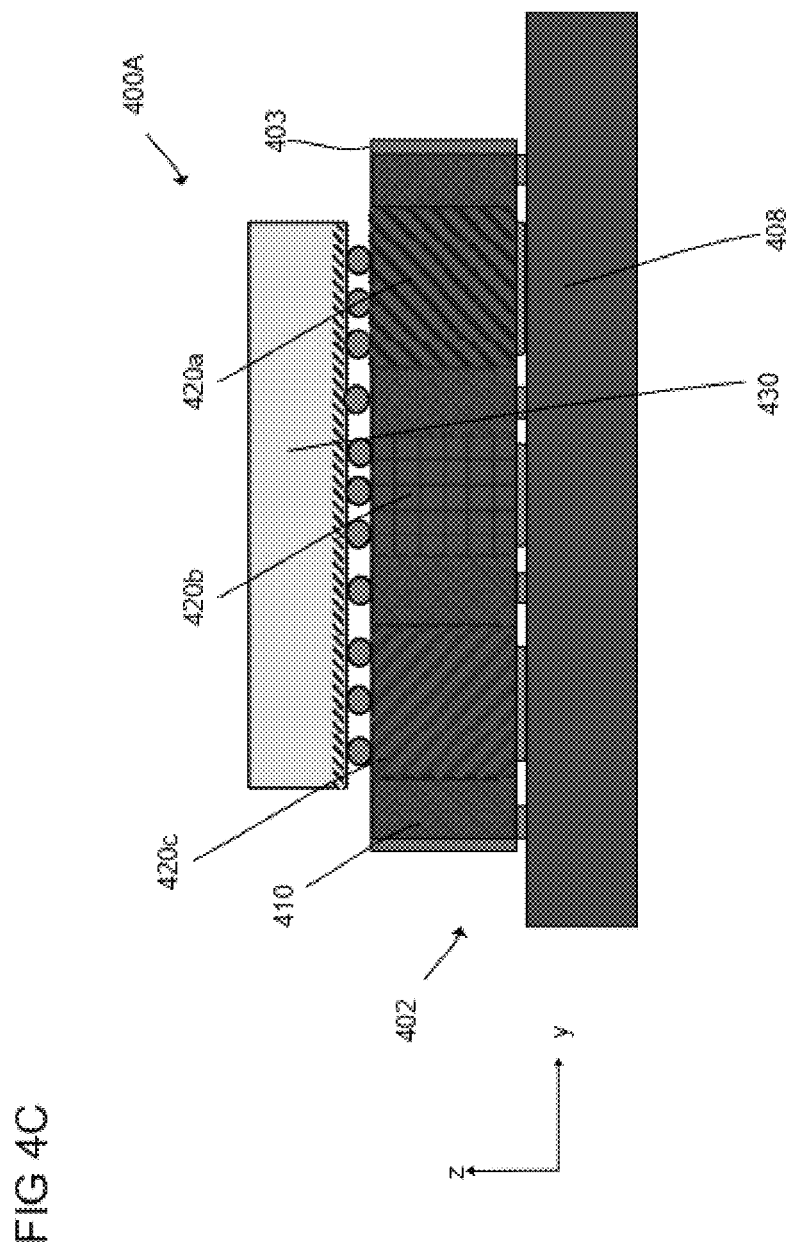

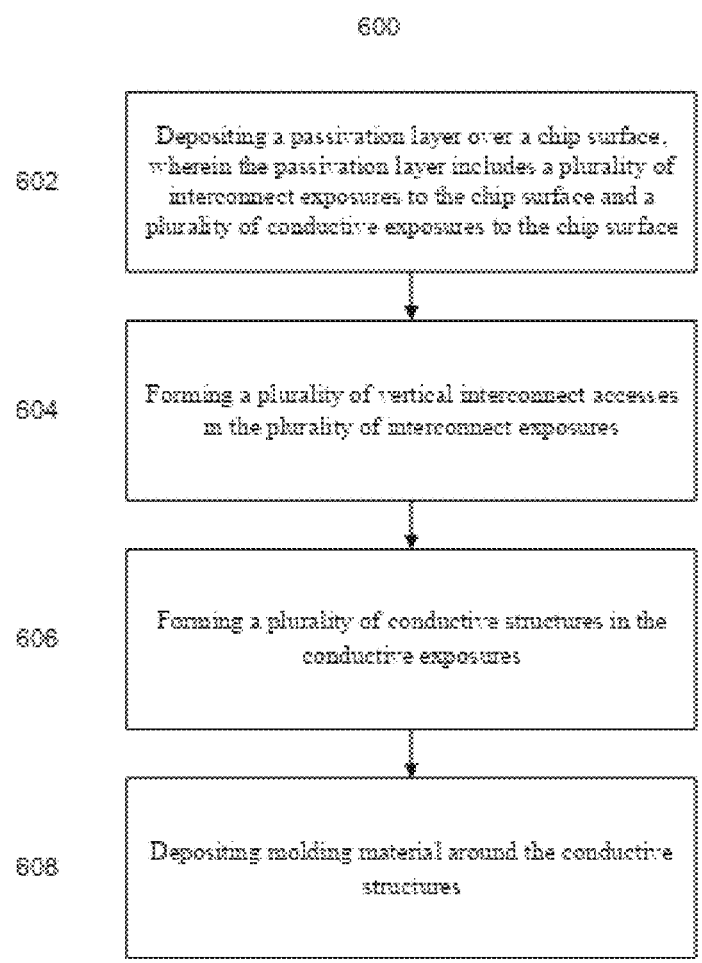

MOLDED POWER DELIVERY INTERCONNECT MODULE FOR IMPROVED IMAX AND POWER INTEGRITY

CROSS-REFERENCE TO RELATED APPLICATIONS

This application claims priority to Malaysian Patent Application No. PI2020004591, filed on Sep. 4, 2020, which is incorporated by reference herein in its entirety.

TECHNICAL FIELD

Various aspects relate generally to the field of semiconductor chip package manufacturing. More particularly devices and methods of creating devices for improved power integrity and current capacity.

BACKGROUND

Semiconductor chip packages with miniaturized interconnect geometry face Imax constraints challenges. For example, semiconductor chip packages with reduced die and/or package substrate footprint may limit current carrying capacity which poses functionality risks for the device. Because devices continue to be miniaturized, a reliable power delivery network is desirable.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. It should be understood that the drawings are diagrammatic and schematic representations of exemplary aspects of the invention, and are neither limitative nor necessarily drawn to scale of the present invention.

In the following description, various aspects of the invention are described with reference to the following drawings, in which:

FIGS. 4A-4C show an exemplary 2.5D stacked package with molded power delivery module for improved Imax and power integrity according to some aspects;

FIG. 6 shows a flow chart illustrating an exemplary method of manufacturing a power delivery module according to some aspects.

DESCRIPTION

Figure 1A:
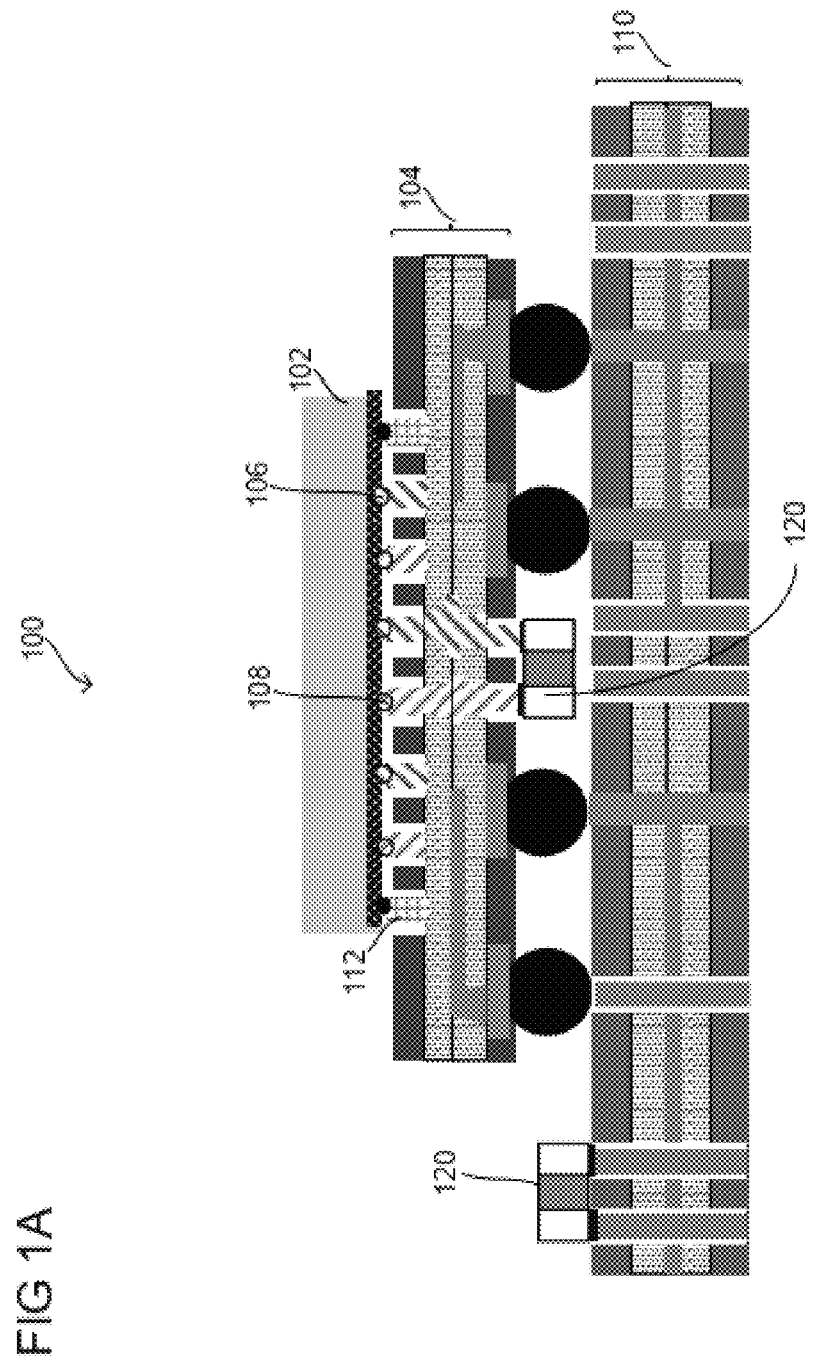
FIGS. 1A and 1B show a semiconductor chip package with vertical interconnects between the package substrate and the die.

The following detailed description refers to the accompanying drawings that show, by way of illustration, specific details and aspects of aspects in which the aspects of this disclosure are practiced.

The word "exemplary" is used herein to mean "serving as an example, instance, or illustration." The words "plurality" and "multiple" in the description and claims refer to a quantity greater than one. The terms "group," "set", "sequence," and the like refer to a quantity equal to or greater than one. Any term expressed in plural form that does not expressly state "plurality" or "multiple" similarly refers to a quantity equal to or greater than one. The term "lesser subset" refers to a subset of a set that contains less than all elements of the set. Any vector and/or matrix notation utilized herein is exemplary in nature and is employed for purposes of explanation. Aspects of this disclosure described with vector and/or matrix notation are not limited to being implemented with vectors and/or matrices and the associated processes and computations may be performed in an equivalent manner with sets or sequences of data or other information.

The term semiconductor chips (also referred to herein as "silicon dies") are generally "packaged" prior to shipping and merging with other electronics packages. This packaging typically involves encapsulating the semiconductor chips in a material and providing electrical contacts on the outside of the housing to provide an interface for the semiconductor chip. Among other things, semiconductor chip packaging can provide protection against impurities, provide mechanical support, dissipate heat and reduce thermo-mechanical stress. Additionally, the term "chiplet" may refer to a semiconductor chip positioned on a base die. The semiconductor chiplet may be smaller in size than the base die.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Although a die may refer to a processor chip, a radio-frequency (RF) chip, an integrated passive device (IPD) chip, or a memory device may be mentioned in the same sentence, but it should not be construed that they are equivalent structures. The appearance of the phrase "aspect" in various places throughout this disclosure are not necessarily all referring to the same aspect. Furthermore, the particular features, structures, or characteristics may be combined in any suitable manner in one or more aspects.

Various features are grouped together for the purpose of streamlining the disclosure. This method of disclosure is not to be interpreted as reflecting an intention that the claims require more features than are expressly recited in each claim. Rather, as the following claims reflect, inventive subject matter lies in less than all features of a single disclosed aspect. Thus the following claims are hereby incorporated into the Detailed Description, with each claim standing on its own as a separate aspect.

FIG. 1A illustrates a cross section view of semiconductor chip package 100. Semiconductor chip package 100 may include capacitors 120. Capacitors 120 may provide electric charges to chip 102 through board 110 and package 104 for power delivery noise reduction. For example, from a board edge capacitor. Alternatively, capacitors 120 may provide electric charges to chip 102 through package 104. For example, from a land-side capacitor. Chip 102 may be connected to package 104 through vertical interconnect access (VIAs) 112, for example a plurality of metal columns and/or a plurality of solder bumps. Additionally, chip 102 may be connected to a package 104 through input voltage terminals 108. For example, a power supply reference voltage (VCC) bump may connect to the input voltage terminal of the chip to an input voltage terminal of the package. The input voltage terminal may include a contact pad, an electrical interconnect and/or a metal plane. Additionally, semiconductor chip 102 may be connected to a package 104 through reference voltage terminals 106. For example, a ground reference voltage (VS S) bump may connect to the reference voltage terminal of the semiconductor chip to a reference voltage terminal of the package. The reference voltage terminal may include a contact pad, an electrical interconnect and/or a metal plane.

Figure 1B:
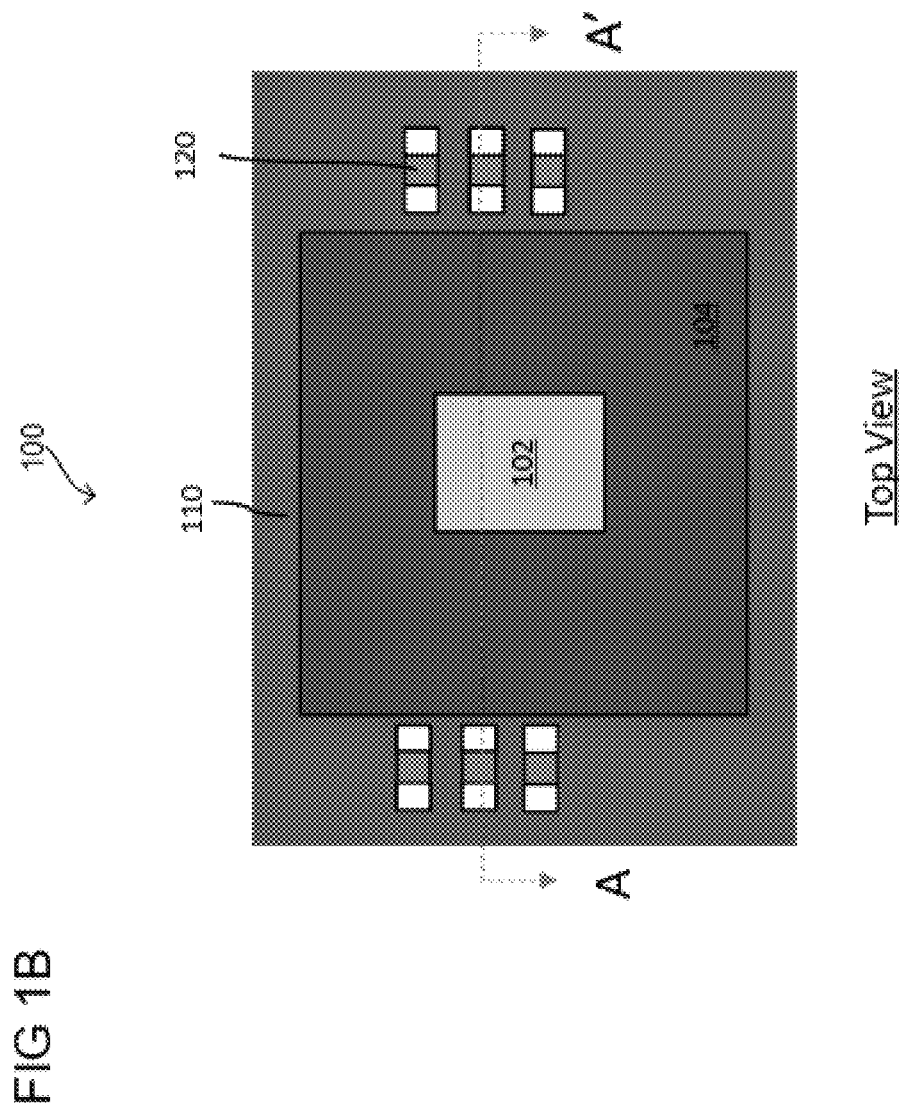

FIG. 1B illustrates a top view of semiconductor chip package 100. Multiple capacitors 120 may be directly connected to board 110 and/or package 104. Semiconductor chip 102 may be directly connected to package 104. Capacitors 120 may provide electric charges to semiconductor chip 102 through the connections as described in FIG. 1A.

Figure 2A:
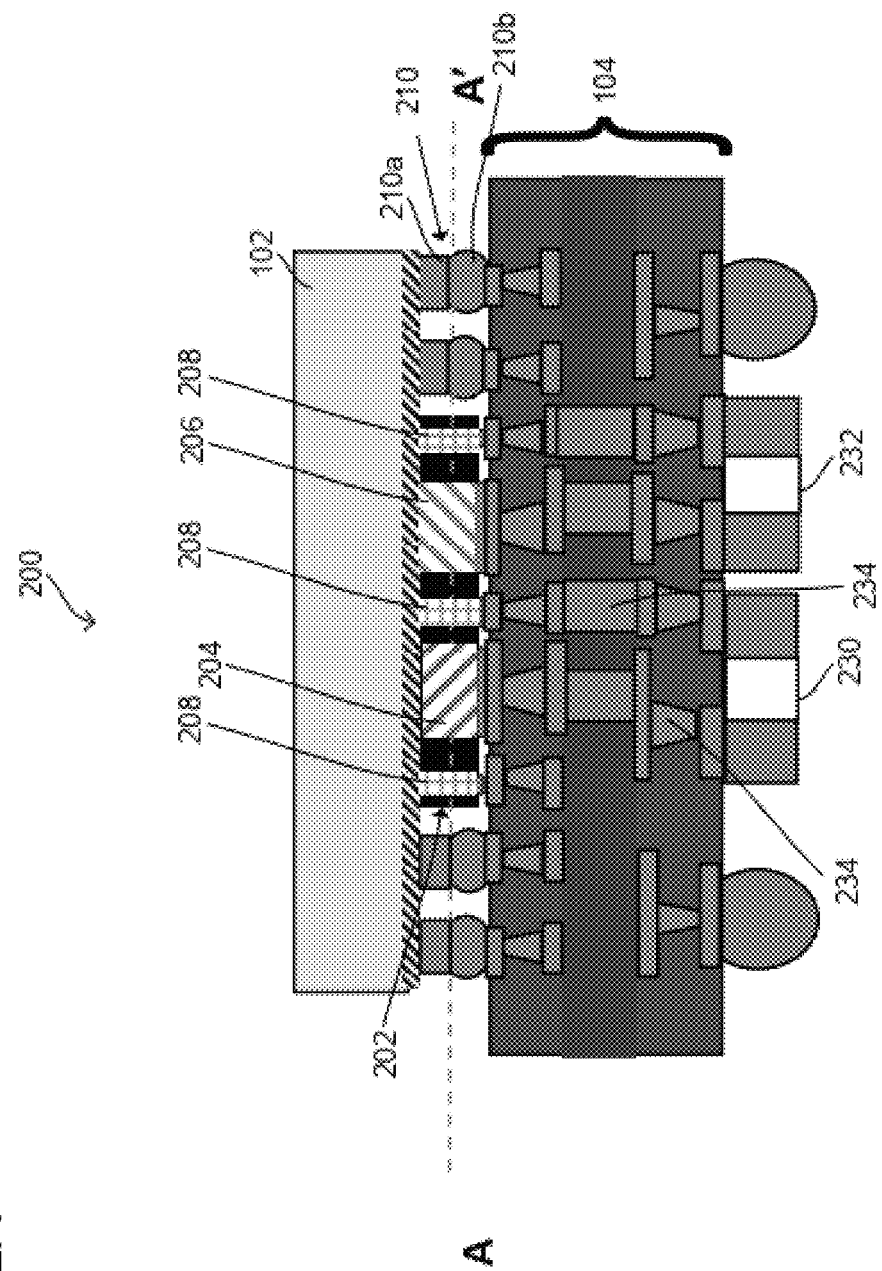
FIGS. 2A and 2B show an exemplary molded power delivery module for improved Imax and power integrity according to some aspects.

FIG. 2A illustrates a cross-section view of semiconductor chip package 200. Semiconductor chip package 200 includes molded power delivery module 202. Molded power delivery module 202 may be an integrated part of semiconductor chip 102. Chip package 200 may include semiconductor chip 102 and package 104 similar to the ones described in FIGS. 1A and 1B. Semiconductor chip 102 may be connected to package 104 through VIAs 210 e.g., a plurality of metal columns 210a and/or a plurality of solder bumps 210b. For example, package solder bumps 210b may connect package 104 to metal columns 210a of semiconductor chip 102. Molded power delivery module 202 may connect to input voltage terminals and reference voltage terminals of the semiconductor chip 102 to input voltage terminals and reference voltage terminals of the package 104 respectively. Molded power delivery module 202 includes several reference conductive structures 208 and several input conductive structures 204 and 206. Input conductive structure 204 may be configured for a different input voltage than input conductive structure 206. One module may deliver two or more input voltages to semiconductor chip 102. Capacitors 230 and 232 may be connected to semiconductor chip 102 through interconnects 234 within package 104 and molded power delivery module 202. Input conductive structure 204 may be connected to an input voltage terminal of semiconductor chip 102 and an input voltage terminal of package 104 associated to a first power supply reference voltage (VCC). A first terminal of capacitor 230 may be connected to the first VCC and the input voltage terminal of package 104. Input conductive structure 206 may be connected to a second input voltage terminal of semiconductor chip 102 and a second input voltage terminal of package 104 associated to a second power supply reference voltage (VCC). A subsequent first terminal of capacitor 232 may be connected to the second VCC and the second input voltage terminal of package 104. The input voltage terminal may include a contact pad, an electrical interconnect and/or a metal plane. Molded power delivery module 202 is configured to alternate between reference conductive structures 208 and input conductive structures 204 and 206. This is done so that each input conductive structure 204 and 206 has a reference conductive structures 208 on either side. Reference conductive structures 208 are connected to reference voltage terminals of semiconductor chip 102 and package 104 associated to a ground reference voltage (VSS). A second terminal of capacitor 230 and a subsequent second terminal of capacitor 232 may be connected to the VSS and the reference voltage terminal of package 104. The reference voltage terminal may include a contact pad, an electrical interconnect and/or a metal plane.

Figure 2B:
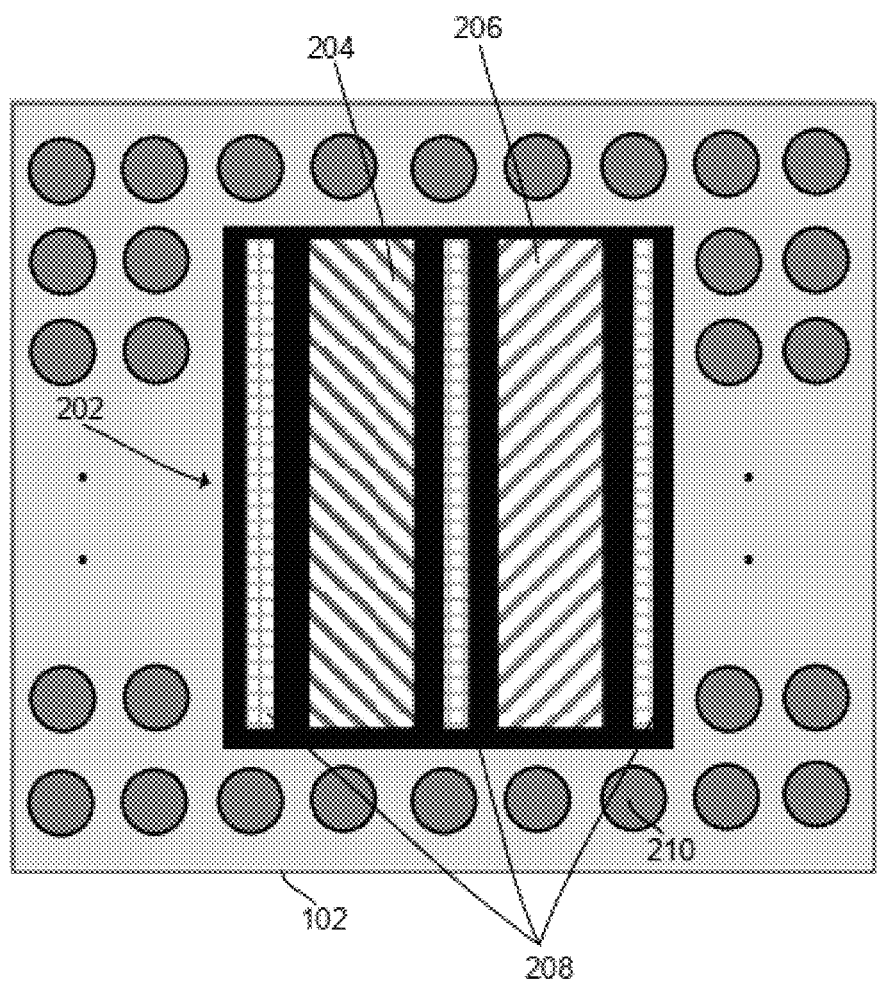

FIG. 2B illustrates a bottom view of semiconductor chip 102. The bottom of semiconductor chip 102 illustrates a plurality of metal columns 210a e.g., a plurality of copper columns 210a with which semiconductor chip 102 may connect to package 104 e.g., through a plurality of solder bumps 210b illustrated in FIG. 2A. The bottom view also illustrates molded power delivery module 202. Reference conductive structures 208 alternate between input conductive structures 204 and 206 so that there is a reference conductive structures 208 between the input conductive structures 204 and 206. Reference conductive structures 208 are also positioned along the periphery of the molded power delivery module 202, extending in a direction parallel to the input conductive structures 204 and 206. This design can be used for two or more input conductive structures. As illustrated in FIG. 2B, reference conductive structures 208 includes a first width (e.g., ranging between 10 μm and 100 μm) and the input conductive structures 204 and 206 include a second width (e.g., ranging between 150 μm and 500 μm) larger than the first width. The plurality of copper columns 210a may encircle at least a portion of the molded power delivery module 202.

Figure 3A:
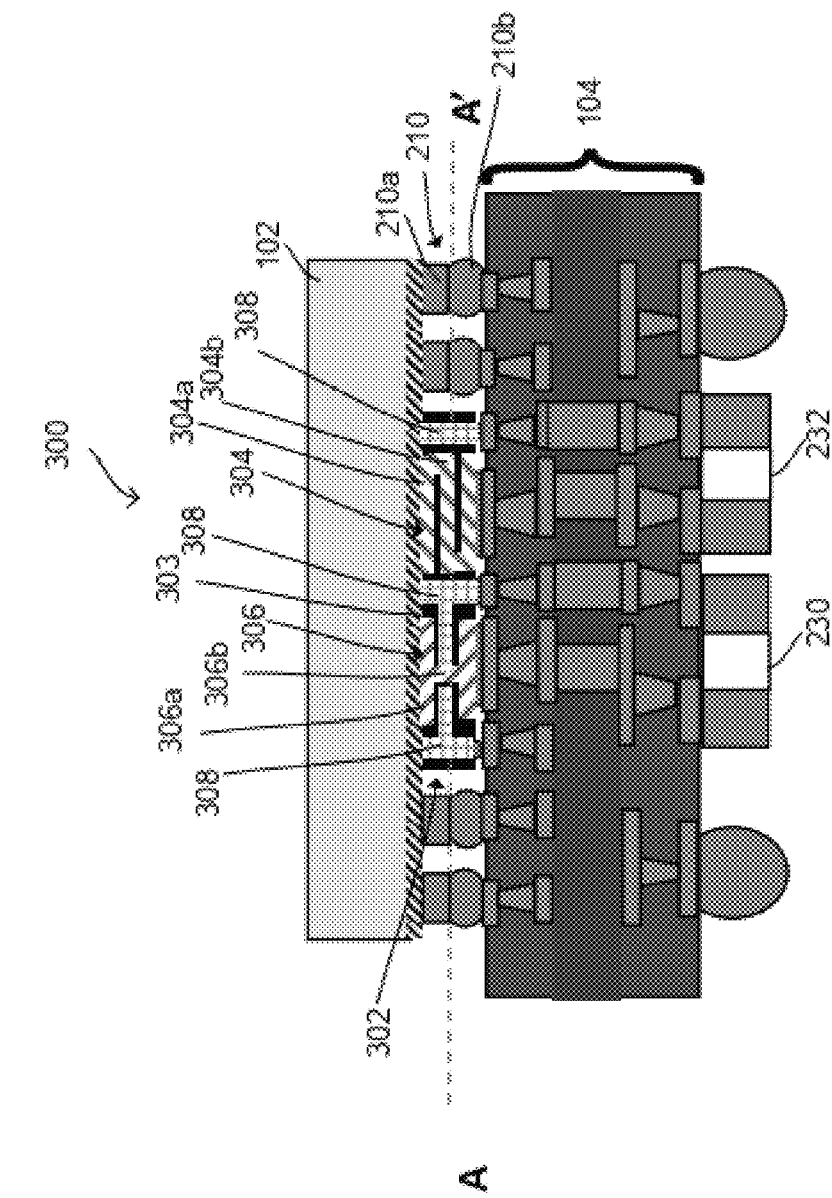
FIGS. 3A and 3B show an exemplary molded power delivery module for improved Imax and power integrity according to some aspects.

FIG. 3A illustrates a cross section view of semiconductor chip package 300. Semiconductor chip package 300 may be similar to semiconductor chip package 200. Chip package 300 includes molded power delivery module 302. Molded power delivery module 302 may be similar to molded power delivery module 202. However, the shape of reference conductive structures 208 and input conductive structures 204 and 206 may be different. As illustrated in FIGS. 2A and 2B, reference conductive structures 208 and input conductive structures 204 and 206 are rectangular. However, molded power delivery module 302 has conductive structures of different shapes. Input conductive structure 304 may have an s-shape or a spiral shape which includes a plurality of metal layers 304a interconnected through a plurality of vertical VIAs 304b. For example, the input conductive structure 304 may include three metal layers 304a interconnected through two vertical VIAs 304b forming a spiral inductor structure. The plurality of metal layers 304a and vertical VIAs 304b are isolated through a mold layer. Input conductive structure 306 may have an I-shape which includes a plurality of metal layers 306a interconnected through a plurality of vertical VIAs 306b. For example, the input conductive structure 306 may include two metal layers 306a interconnected through one or more vertical VIAs 304b forming an I-shape structure. Reference conductive structures 308 may be rectangular or be shaped to fill in space created by the shape of input conductive structures 304 and 306. For example, the two left most reference conductive structures 308 have a T-shape to fill in space left by the I-shape of input conductive structure 306 and/or may be configured to interleave with the I-shape input conductive structure 306 for improved electrical performance e.g., reduced loop inductance and/or enhanced capacitance.

Figure 3B:
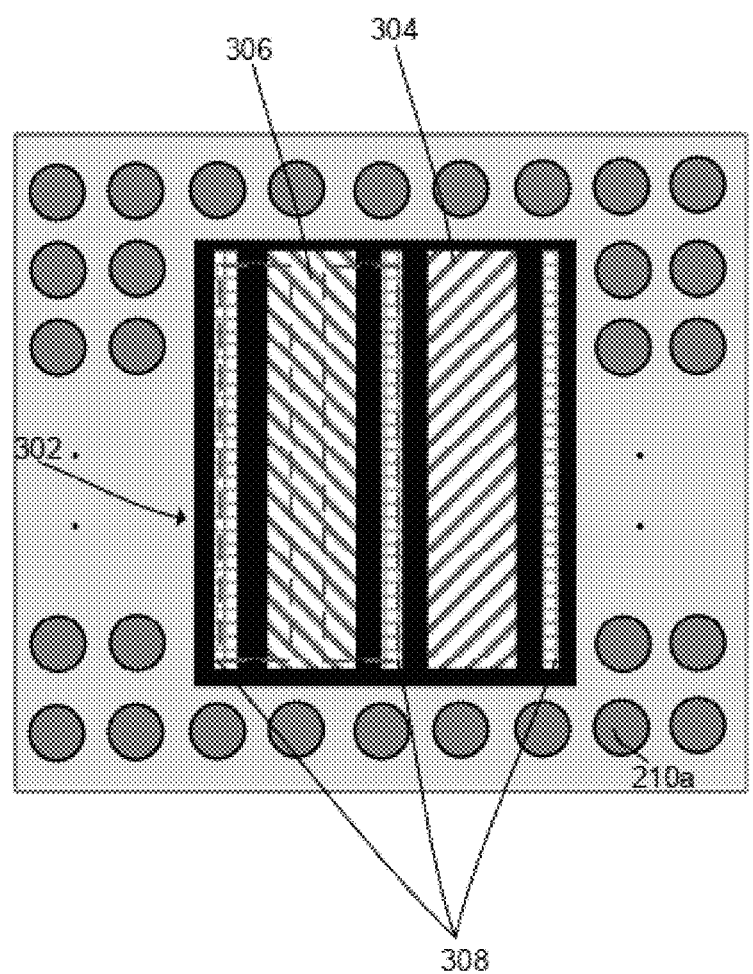

FIG. 3B illustrates a bottom view of semiconductor chip 102 with the molded power delivery module 302. The dotted lines of the two left most reference conductive structures 308 illustrate how it may cut into the space left by I-shaped input conductive structure 306. The plurality of metal columns 210a may encircle at least a portion of the molded power delivery module 302.

Figure 4A:
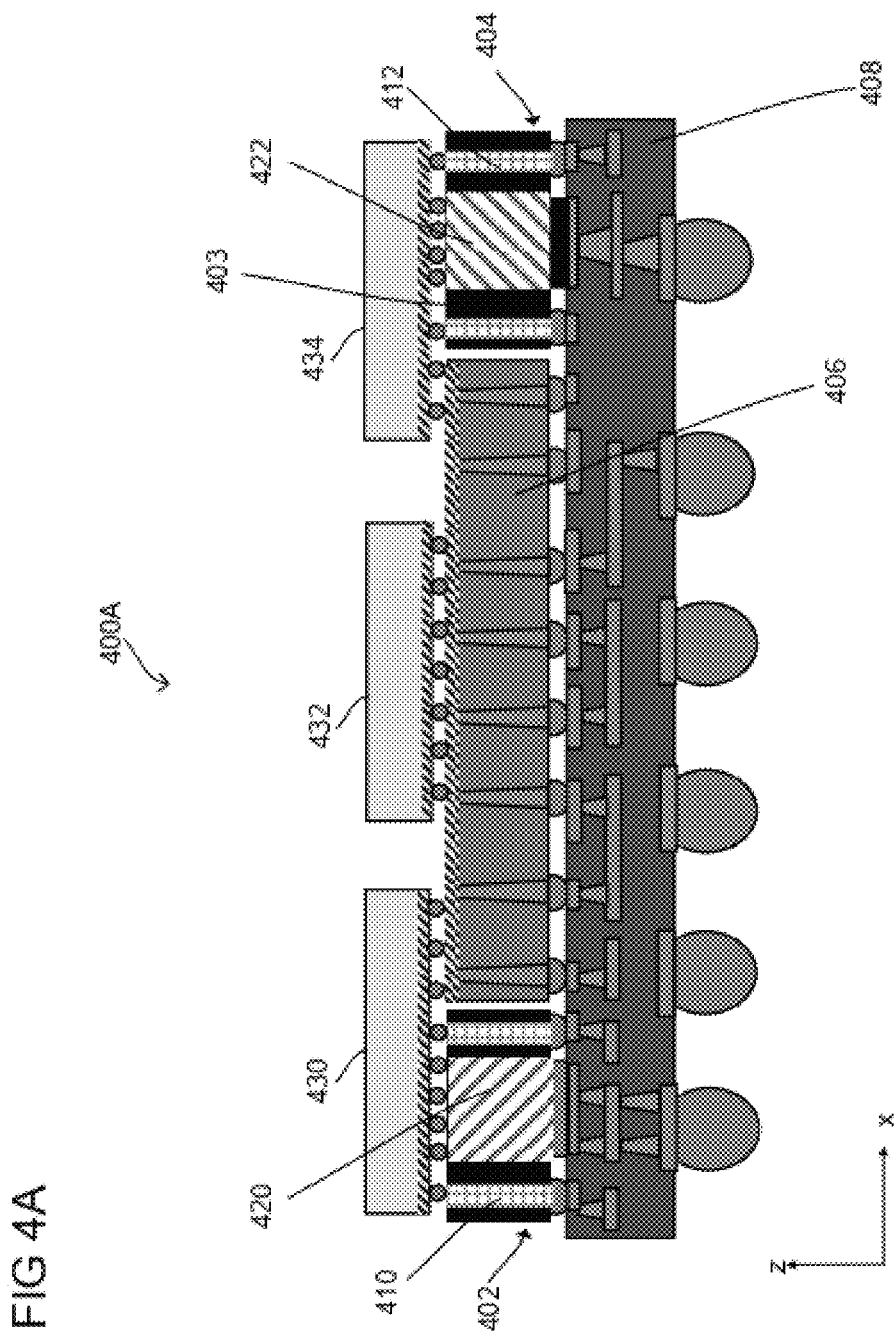

FIG. 4A illustrates a cross section view of semiconductor chip package 400A. Chip package 400A includes two molded power delivery modules 402 and 404. Each molded power delivery module 402 and 404 may be configured for a different input voltage. Molded power delivery module 402 includes input conductive structure 420 and reference conductive structures 410. Reference conductive structures 410 are connected to reference voltage terminals of semiconductor chip 430 and package 408. Input conductive structure 420 is connected to input voltage terminals of semiconductor chip 430 and package 408. Molded power delivery module 404 includes input conductive structure 422 and reference conductive structures 412. Reference conductive structures 412 are connected to reference voltage terminals of semiconductor chip 434 and package 408. Input conductive structure 422 is connected to input voltage terminals of semiconductor chip 434 and package 408. The reference voltage terminals and the input voltage terminals of semiconductor chips 430, 434 and package 408 may include a contact pad, an electrical interconnect and/or a metal plane. Chip package 400A further includes interposer 406. Interposer 406 may be connected to semiconductor chips 430 and 434 and to package 408 without an intermediary power delivery module. Chip 432 may be connected to package 408 through interposer 406. Chip 432 may be connected to package 408 through semiconductor chips 430, 434 and power delivery modules 402, 404. If some input terminals of semiconductor chips 430 and/or 434 do not require a molded power delivery module, those inputs are connected to package 408 through interposer 406. While inputs requiring a molded power delivery module are connected to package 408 through respective power delivery modules 402 and 404. If semiconductor chip 432 does not include inputs that require a power delivery module all inputs are connected to package 408 through interposer 406.

Figure 4B:
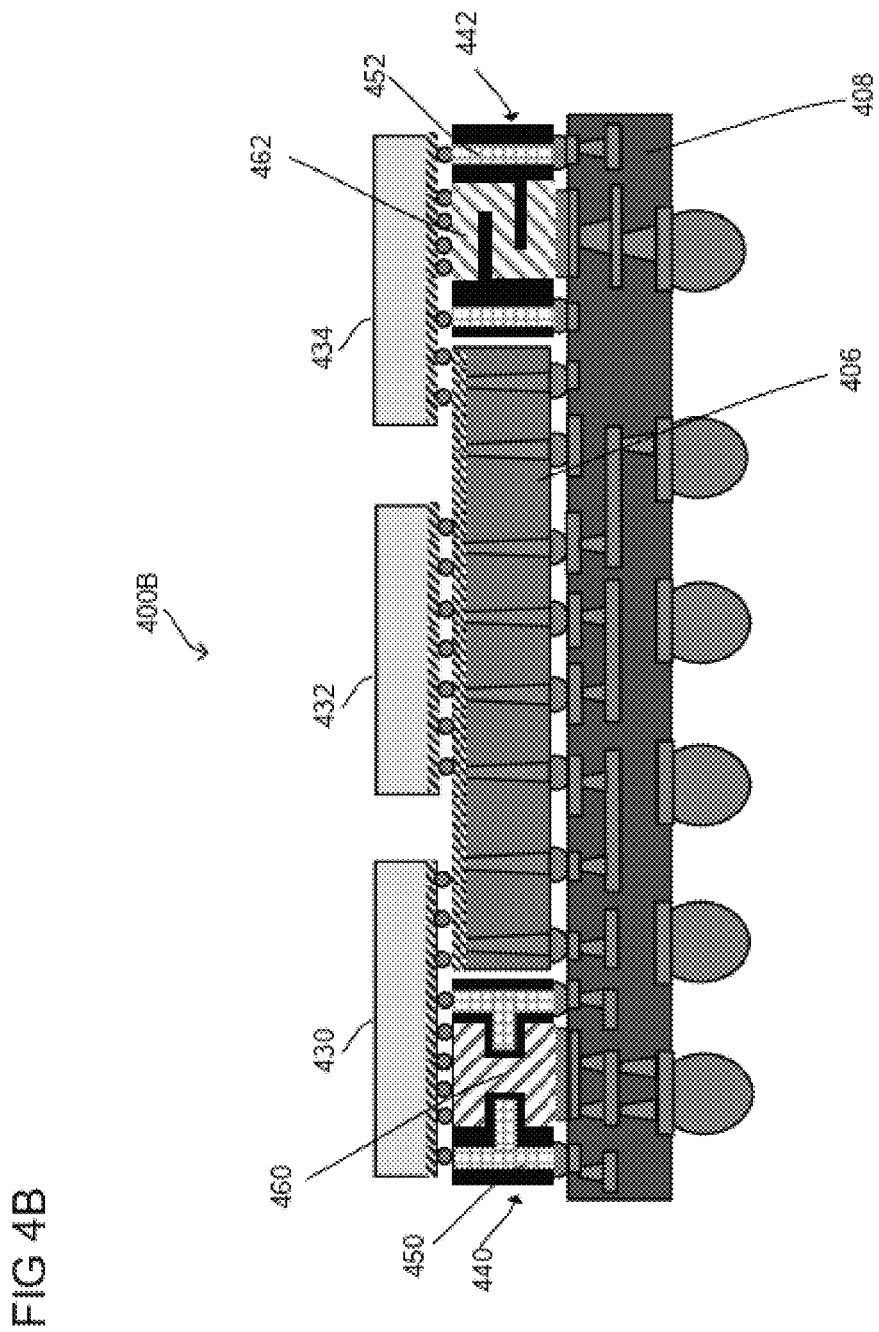

FIG. 4B illustrates a cross section view of semiconductor chip package 400B similar to package 400A described in FIG. 4A. Molded power delivery modules 440 and 442 differ from molded power delivery modules 402 and 404 of FIG. 4A by the shape of the conductive structures such as those described in FIGS. 3A and 3B.

FIG. 4C illustrates a side view of semiconductor chip package 400A described in FIG. 4A. Molded power delivery module 402 includes additional input conductive structures 420a, 420b, and 420c extending in parallel to reference conductive structure 410. Input conductive structure 420b may be coupled to a second power supply voltage (VCC) e.g., 1.0 volt (V) different than the input conductive structure 420a e.g., 1.5 V. Input conductive structure 420c may be coupled to a third power supply voltage (VCC) e.g., 1.8 V different than the input conductive structures 420a and 420b. Input conductive structures 420a, 420b and 420c may be isolated through mold layer 403.

FIGS. 5A-5I illustrate a method of manufacture for a semiconductor chip package including a molded power delivery module.

Figure 5A:
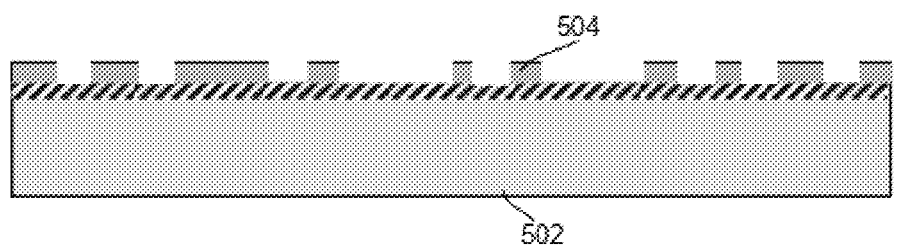
FIGS. 5A-5I show an exemplary method of manufacturing a power delivery module according to some aspects.

FIG. 5A illustrates forming passivation layer 504 on the surface of semiconductor chip 502. For example, forming passivation layer 504 using lamination, photolithography, and etching processes. For example, etching away passivation layer to allow contact between chip 502 and conductive structures of the power delivery module.

Figure 5B:
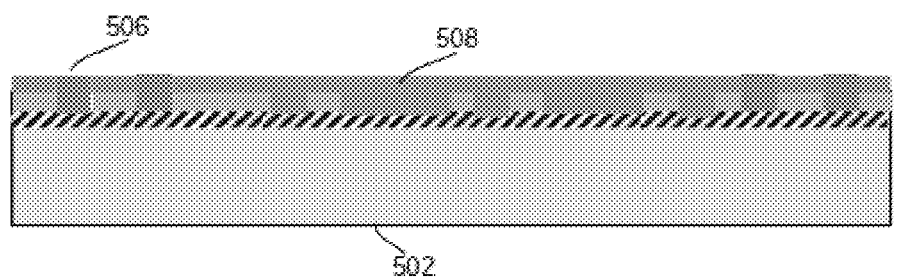

FIG. 5B illustrates forming vertical interconnect accesses (copper columns) 506. Further, DFR layer 508 disposed and developed. For example, disposing and developing DFR layer 508 through lamination, photolithography, etching, and electroplating processes. Developing DFR layer 508 in place for the copper columns 506 of semiconductor chip 502.

Figure 5C:
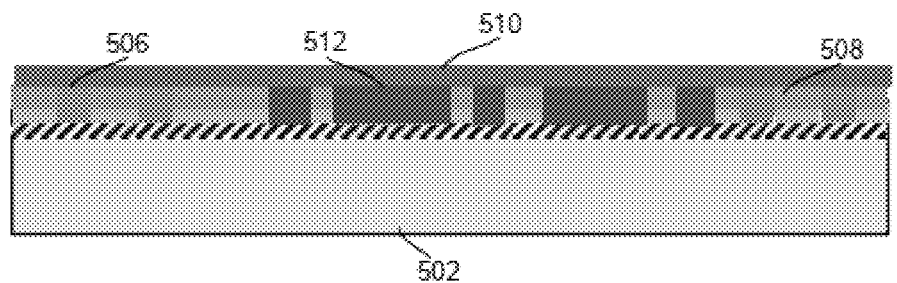

FIG. 5C illustrates developing DFR layer 512. For example, developing DFR layer 508 with UV development and/or a lamination process. DFR layer 510 is disposed over copper columns 506 and DFR layer 508 for the conductive structures of a molded power delivery module.

Figure 5D:
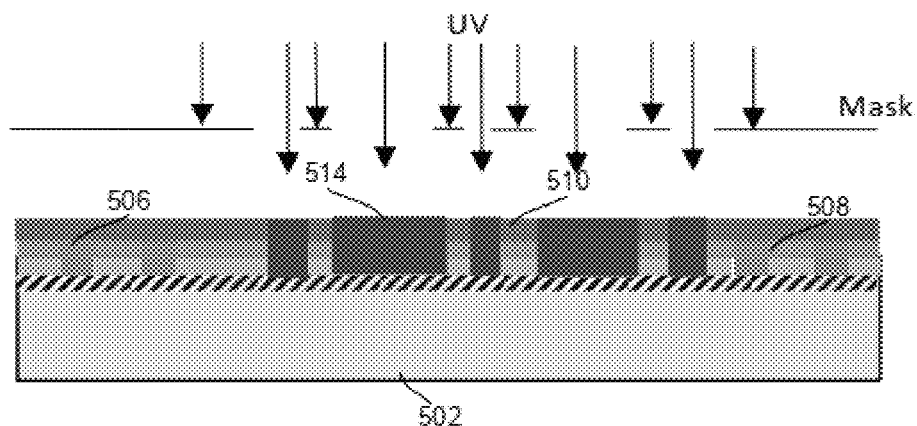

FIG. 5D illustrates developing DFR layer 514, made up from developing DFR layer 510. For example, developing DFR layer 510 with a UV photolithography process.

Figure 5E:
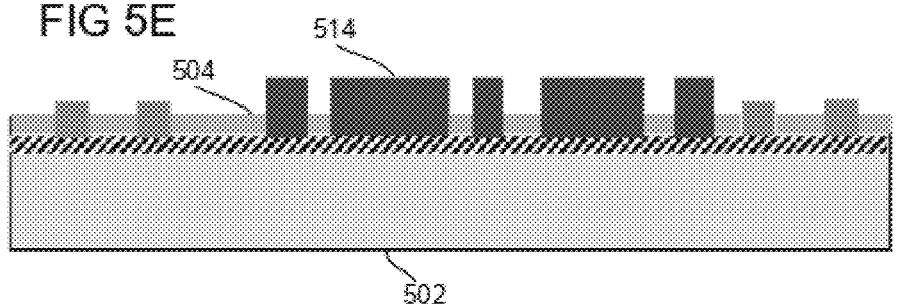

FIG. 5E illustrates removing the undeveloped portion of DFR layers 508 and 510. For example, removing undeveloped portions of DFR layers 508 and 510 through a chemical etching process to expose portions of passivation layer 504. For example, portions of the passivation layer 504 where molding material will later be disposed.

Figure 5F:
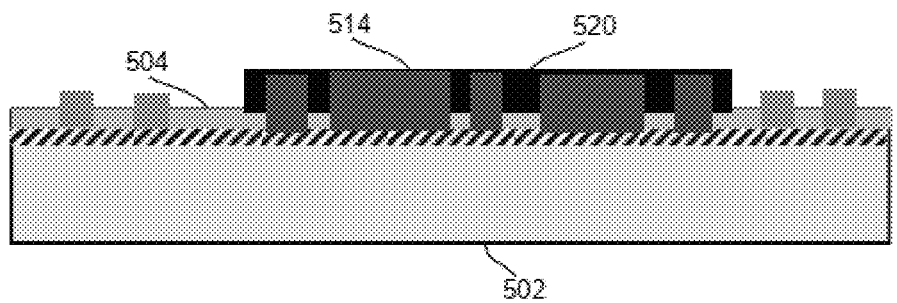

FIG. 5F illustrates disposing a molding layer 520 over developed layer 514. Molding layer 520 extends over a portion of passivation layer 504. Disposing molding layer 520 by a compression, transfer, and/or injection molding process.

Figure 5G:
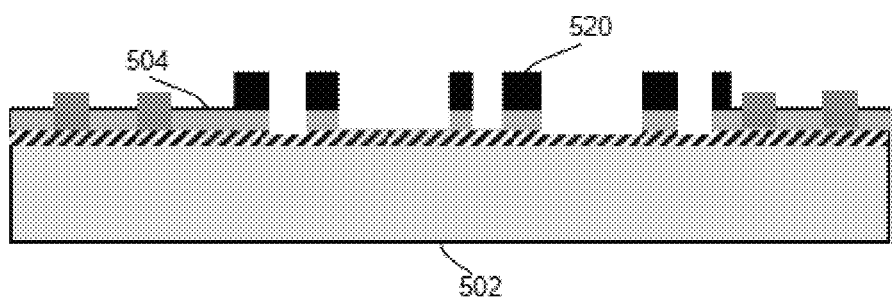

FIG. 5G illustrates removing the developed DFR layer 514. Developed DFR layer 514 was made up of developed portions of DFR layers 508 and 510. For example, removing developed layer 514 by chemical etching processes. DFR layer 514 may be exposed through mold layer 520 grinding or planarization process.

Figure 5H:
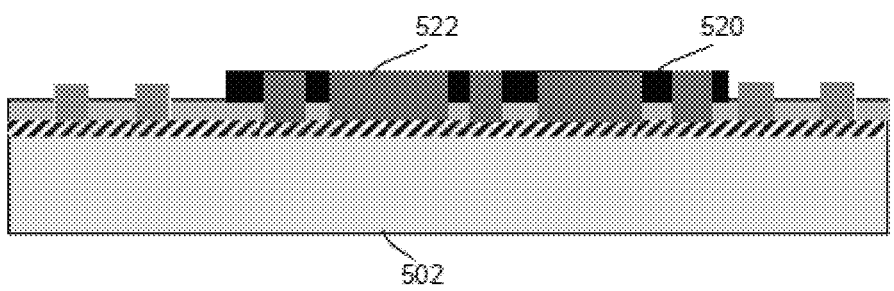

FIG. 5H illustrates forming the conductive structures 522 within opening of mold layer 520 to create the molded power delivery module. Both reference conductive structures and input conductive structures are formed. Forming conductive structures 522 through plating or conductive paste printing.

Figure 5I:
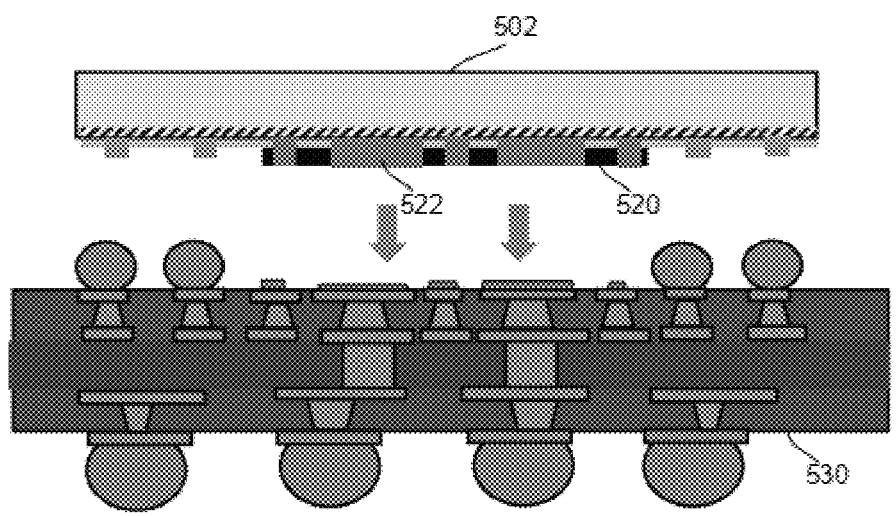

FIG. 5I illustrates attaching the semiconductor chip 502 with molded power delivery module (molding layer 520 and conductive structures 522) to package 530. For example, attaching all parts of the semiconductor chip package using thermal compression bonding and/or reflow process.

FIG. 6 shows a flow chart illustrating an exemplary method 600 of method of manufacturing a power delivery module according to some aspects. As shown in FIG. 6, method 600 includes depositing a passivation layer over a semiconductor chip surface, wherein the passivation layer includes a plurality of interconnect exposures to the chip surface and a plurality of conductive exposures to the chip surface (602), forming a plurality of vertical interconnect accesses in the plurality of interconnect exposures (604), forming a plurality of conductive structures in the conductive exposures (606), and depositing molding material around the conductive structures (608).

Minimizing the amount of power and ground bumps aids in semiconductor chip package miniaturization. Increasing the number of power (Vcc) and ground (Vss) bumps for semiconductor chip to packages are not desirable. For example, Vcc and Vss bumps for semiconductor chip to package interconnects, stacked chip Vcc and Vss microbumps for 2.5D stacked package architecture, Vcc and Vss through mold VIAs (TMVs) for direct stacked chiplets or dies to package interconnects, and package Vcc and Vss solder ball interconnects to achieve Imax carrying capacity.

Additionally, reducing the Imax carrying capacity threshold to avoid reliability risk is also undesirable because it may impact performance.

Certain aspects of this disclosure allow for improved current carrying capacity and power delivery while maintaining a miniaturized form factor. Certain aspects of this disclosure include a molded power delivery interconnect module which may include a mold substrate layer. The mold substrate layer may contain several conductive structures. The front, back and sides of the conducive structures are encased in molding material. However, the top and bottom of the conductive structures are exposed. This allows for forming connections between the conductive structures and the semiconductor chip and/or package. The conductive structures are visible in the power delivery module from the top or bottom. However, the four remaining sides of the power delivery module would not have any exposed conductive structures and only molding material would be visible. Within the power delivery module reference conductive structures are narrower than input conductive structures. Reference conductive structures alternate around the input conductive structures. The space between conductive structures is filled with molding material.

In an aspect of present disclosure, the molded power delivery module is disposed on a semiconductor chip and coupled to a power delivery network of the semiconductor chip through a plurality of contact pads. Additionally, the chip surface may include a plurality of vertical interconnects e.g., a plurality of copper columns. The interconnects have a height less than that of the molded power delivery module and may partially encircle the molded power delivery interconnect module on the surface of the chip.

The molded power delivery module has increased interconnect volume between stacked semiconductor chiplets and a base die or between semiconductor chips and a package substrate. For example, through the input conductive structures connected between components as previously mentioned.

The molded power delivery module allows device miniaturization. For example, reducing the footprint associated with the amount of micro-bumps in a stacked semiconductor package. Alternatively, reducing the footprint associated with the amount of C4 bumps for Vcc power voltages and Vss reference voltages in a monolithic die semiconductor package. This also reduces the risk of package warpage.

A molded power delivery interconnect module may be disposed on a surface of a semiconductor chip or silicon die. For example, a central processing unit (CPU), a platform controller hub (PCH), a memory device, a graphic processing unit (GPU), or a field programmable gate array (FPGA). The molded power delivery module may include a mold substrate layer. For example, an epoxy polymer substrate layer. The reference conductive structures have a narrower width than the input conductive structures. For example, the reference conductive structures may have a width ranging from 10 μm to 100 μm and input conductive structures may have a width ranging from 150 μm to 500 μm. For non-rectangular shaped conductive structures, the widths described above should refer to the exposed surfaces of the conductive structures connected to the semiconductor chip and/or package.

A molded power delivery interconnect module separates the conductive structures with molding material as previously described. For example, a reference conductive structure may be separated from an input conductive structure by 10 μm to 100 μm of molding material.

The exposed surfaces of the conductive structures in the module are coupled to a power delivery network of the semiconductor chip through a plurality of contact pads. For example, the reference conductive structure is coupled to a first reference voltage, such as a ground reference voltage (Vss), to facilitate current return path. The input conductive surfaces may be coupled to a second reference voltage, such as a power supply voltage (Vcc), to facilitate power delivery between the package substrate and the chip.

The power delivery module may include more than one input conductive structure. The second input conductive structure associated to a different voltage than the first input conductive structure. For example, a second power supply voltage (Vcc). For example, the first input conductive structure may be associated with a 1.0 V power rail and the second input conductive structure may be associated with a 1.5 V power rail. Additional, reference conductive structures may extend through at least a portion of the molded power delivery interconnect module to facilitate current return path.

A semiconductor chip surface may include a plurality of vertical interconnects at least partially surrounding the molded power delivery module attached to the same semiconductor chip surface. The vertical interconnects may have a height that is less than the height of the molded power delivery module. For example, if the vertical interconnects may have a height ranging from 10 μm to 50 μm and the molded power delivery module may have a height ranging from 30 μm to 80 μm. The vertical interconnects may be made out of different materials. For example, the vertical interconnects may include copper columns or solder bumps. The power delivery module may be electrically coupled to the package substrate. For example, a solder interconnect layer may electrically connect the module with the package to facilitate power delivery.

The vertical interconnects may be electrically coupled to the package substrate. For example, package solder bumps may connect the vertical interconnects to the package to facilitate data signal transmission. The molded power delivery module may be electrically coupled to at least one passive component. For example, the module may be connected to a decoupling capacitor coupled to the package. For example, the capacitor may be connected on a package landside opposite the semiconductor chip.

The molded power delivery interconnect module may also be connected in a 2.5D stacked package configuration. The molded module may be positioned on a package substrate adjacent to a base die. For example, if the 2.5D stacked package configuration has one base die there can be two power delivery modules on either side of the base die, partially encircling the base die. The base die may be a silicon interposer, for example. A plurality of semiconductor chiplets may be connected to the base die. The chiplets may be a system-on-chip, a central processing unit (CPU) core, a graphic processing unit (GPU) or a memory device. The chiplets may be partially or wholly positioned on the base die. Chiplets partially positioned on a portion of the base die may also be partially positioned on the molded power delivery module. The chiplets may be electrically coupled to the package substrate through the molded power delivery interconnect module.

Multiple input conductive structures may be sandwiched in between two reference conductive structures. The pair of reference conductive structures may be associated with a ground reference voltage (Vss). The multiple input conductive structures may be associated with one or more power supply voltages (Vcc). The chiplets may be electrically coupled to the input and reference conductive structures of the power delivery module. For example, micro-bumps connect the chiplets to the conductive structures of the molded module. The molded module is further electrically coupled to the package substrate through a plurality of package solder bumps and/or solder interconnects.

Forming a power delivery module may be done in a variety of ways. For example, the following steps may be one way to form a molded power delivery module. Form a passivation layer on silicon surface. For example, on a semiconductor chip surface using lamination, photolithography, and/or etching processes. Dispose and develop a first dry film resist (DFR) layer. Form vertical interconnects. For example, vertical interconnects may be Cu columns. The DFR layer may be disposed or developed using lamination, photolithography, etching, and/or electroplating processes. Re-develop the first DFR layer and dispose second DFR layer over the copper columns and the first DFR layer. DFR layers may be developed using UV development, UV photolithography, and/or lamination processes. Develop the second DFR layer. Remove portions of the first and second DFR layers. For example, through chemical etching process. Dispose mold layer over developed second DFR layer. For example, through compression, transfer, or injection molding process. Remove developed second DFR layer. For example, through grinding or chemical etching process. Form conductive structures/planes within the openings in the mold layer. For example, through plating, conductive paste printing, grinding, or etching process. Attach molded interconnect module to package substrate. For example, through thermal compression bonding or reflow process. Process flow may be interchangeable or other steps may be included.

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common semiconductor chip or chassis to form an integrated element, executing discrete software components on a common processor core, etc. Conversely, skilled persons will recognize the possibility to separate a single element into two or more discrete elements, such as splitting a single circuit into two or more separate circuits, separating a semiconductor chip or chassis into discrete elements originally provided thereon, separating a software component into two or more sections and executing each on a separate processor core, etc.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

The following examples disclose various aspects of this disclosure:

Example 1 is a chip package including a chip including a first chip input voltage terminal configured to receive a first voltage and a second chip input voltage terminal configured to receive a second voltage; a substrate including a plurality of exterior voltage terminals on a side of the substrate facing away from the chip and a plurality of interior voltage terminals on a side of the substrate facing the chip, wherein each of the plurality of interior voltage terminals are electrically coupled with one of the exterior voltage terminals, wherein a first exterior package voltage terminal is configured to receive the first voltage, wherein a second exterior package voltage terminal is configured to receive the second voltage; and a power delivery module arranged between the substrate and the chip and including a plurality of input conductive structures and a plurality of reference conductive structures, wherein the input conductive structures alternate between the plurality of reference conductive structures, wherein a first input conductive structure is electrically coupled to the first chip input voltage terminal and the first package interior voltage terminal, wherein a second input conductive structure is electrically coupled to the second chip input voltage terminal and the second interior package voltage terminal, wherein each of the plurality of reference conductive structures are electrically coupled with a chip reference terminal and a package reference terminal.

In Example 2, the subject matter of Example 1 can optionally further include wherein the reference conductive structures are narrower than the first input conductive structure and the second conductive structure.

In Example 3, the subject matter of Examples 1 or 2 can optionally further include wherein the first input conductive structure is s-shaped.

In Example 4, the subject matter of Examples 1 to 3 can optionally further include wherein the second input conductive structure is i-shaped.

In Example 5, the subject matter of Examples 1 to 4 can optionally further include wherein at least one of the plurality of reference conductive structures is t-shaped.

In Example 6, the subject matter of Examples 1 to 5 can optionally further include wherein the first input conductive structure, the second input conductive structure, and the plurality of conductive structures are encased in a molding material.

In Example 7, the subject matter of Examples 1 to 6 can optionally further include wherein the first input conductive structure, the second input conductive structure, the plurality of conductive structures, and the molding material have the same height.

In Example 8, the subject matter of Examples 1 to 7 can optionally further include wherein the first input conductive structure and the second input conductive structure are positioned in between a pair of the plurality of reference conductive structures along a width of the molding material.

In Example 9, the subject matter of Examples 1 to 8 can optionally further include wherein the first input conductive structure, the second input conductive structure, and the plurality of reference conductive structures have a structure length that is less than a molding material length.

In Example 10, the subject matter of Examples 1 to 9 can optionally further include wherein the input conductive structures have a width between 150 μm and 500 μm.

In Example 11, the subject matter of Examples 1 to 10 can optionally further include wherein the reference conductive structures have a width between 10 μm and 100 μm In Example 12, the subject matter of Examples 1 to 11 can optionally further include wherein the chip includes a plurality of vertical interconnects.

In Example 13, the subject matter of Examples 1 to 12 can optionally further include wherein the plurality of vertical interconnects have a length between 10 μm and 50 μm.

In Example 14, the subject matter of Examples 1 to 13 can optionally further include wherein the power delivery module has a height between 30 μm and 80 μm.

Example 15 is a chip package including a chip including a chip input voltage terminal configured to receive a voltage; a substrate including an exterior voltage terminal on a side of the substrate facing away from the chip and an interior voltage terminal on a side of the substrate facing the chip, wherein interior voltage terminal is electrically coupled with the exterior voltage terminal, wherein the exterior package voltage terminal is configured to receive the voltage; and a power delivery module arranged between the substrate and the chip and including an input conductive structure and a pair of reference conductive structures, wherein the input conductive structure is positioned between the pair of reference conductive structures, wherein the input conductive structure is electrically coupled to the chip input voltage terminal and the package interior voltage terminal, wherein each of the pair of reference conductive structures are electrically coupled with a chip reference terminal and a package reference terminal.

In Example 16, the subject matter of Example 15 can optionally further include wherein the reference conductive structures are narrower than the input conductive structure.

In Example 17, the subject matter of Examples 15 or 16 can optionally further include wherein the input conductive structure is s-shaped.

In Example 18, the subject matter of Examples 15 to 17 can optionally further include wherein the input conductive structure is i-shaped.

In Example 19, the subject matter of Examples 15 to 18 can optionally further include wherein at least one of the plurality of reference conductive structures is t-shaped.

In Example 20, the subject matter of Examples 15 to 19 can optionally further include wherein the input conductive structure and the plurality of conductive structures are encased in a molding material.

In Example 21, the subject matter of Examples 15 to 20 can optionally further include wherein the input conductive structure, the plurality of conductive structures, and the molding material have the same height.

In Example 22, the subject matter of Examples 15 to 21 can optionally further include wherein the input conductive structure is positioned in between a pair of the plurality of reference conductive structures along a width of the molding material.

In Example 23, the subject matter of Examples 15 to 22 can optionally further include wherein the input conductive structure and the plurality of reference conductive structures have a structure length that is less than a molding material length.

In Example 24, the subject matter of Examples 15 to 23 can optionally further include wherein the input conductive structure has a width between 150 μm and 500 μm.

In Example 25, the subject matter of Examples 15 to 24 can optionally further include wherein the reference conductive structures have a width between 10 μm and 100 μm.

In Example 26, the subject matter of Examples 15 to 25 can optionally further include wherein the chip includes a plurality of vertical interconnects.

In Example 27, the subject matter of Examples 15 to 26 can optionally further include wherein the plurality of vertical interconnects have a length between 10 μm and 50 μm.

In Example 28, the subject matter of Examples 15 to 27 can optionally further include wherein the power delivery module has a height between 30 μm and 80 μm.

Example 29 is a semiconductor chip package including: a semiconductor chip including a chip input voltage terminal and a chip reference voltage terminal; a package substrate including one or more package input voltage terminals and one or more package reference voltage terminals, wherein the one or more package input voltage terminals are configured to receive a first voltage, wherein the one or more package reference voltage terminals are configured to receive a second voltage; and a molded power delivery module arranged between the package substrate and the semiconductor chip and including a plurality of input conductive structures and a plurality of reference conductive structures, wherein the plurality of input conductive structures alternate between the plurality of reference conductive structures, wherein the plurality of input conductive structures are coupled to the chip input voltage terminal and the package input voltage terminal, wherein the plurality of reference conductive structures are coupled to the chip reference voltage terminal and the package reference voltage terminal.

In Example 30, the subject matter of Example 29 may optionally include wherein the plurality of reference conductive structures are coupled to a ground reference voltage (Vss) and the plurality of input conductive structures are coupled to a power supply voltage (Vcc).

In Example 31, the subject matter of Examples 29 and 30 may optionally include wherein the at least one of the plurality of input conductive structures is s-shaped.

In Example 32, the subject matter of Examples 29 to 31 may optionally include wherein the at least one of the plurality plurality of input conductive structures is i-shaped.

In Example 33, the subject matter of Examples 29 to 32 may optionally include wherein at least one of the plurality of reference conductive structures is t-shaped.

In Example 34, the subject matter of Examples 29 to 33 may optionally include wherein the plurality of input conductive structures and the plurality of reference conductive structures are encased in a molding material.

In Example 35, the subject matter of Examples 29 to 34 may optionally include wherein the plurality of input conductive structures, the plurality of reference conductive structures, and the molding material have the same height.

In Example 36, the subject matter of Examples 29 to 35 may optionally include wherein the plurality of input conductive structures are positioned in between a pair of the plurality of reference conductive structures along a width of the molding material.

In Example 37, the subject matter of Examples 29 to 36 may optionally include wherein the plurality of input conductive structures, and the plurality of reference conductive structures have a structure length that is less than a molding material length.

In Example 38, the subject matter of Examples 29 to 37 may optionally include wherein the input conductive structures have a width between 150 μm and 500 μm.

In Example 39, the subject matter of Examples 29 to 38 may optionally include wherein the reference conductive structures have a width between 10 μm and 100 μm In Example 40, the subject matter of Examples 29 to 39 may optionally include wherein the semiconductor chip includes a plurality of vertical interconnects encircling at least a portion of the molded power delivery module.

In Example 41, the subject matter of Examples 29 to 40 may optionally include wherein the plurality of vertical interconnects include a height between 10 μm and 50 μm.

In Example 42, the subject matter of Examples 29 to 41 may optionally include wherein power delivery module is integrated to the semiconductor chip.

Example 43 is a semiconductor chip package including: a semiconductor chip including a chip input voltage terminal configured to receive an input voltage and chip reference voltage terminal configured to receive a reference voltage; a package substrate including one or more package input voltage terminals and one or more package reference voltage terminals, wherein the one or more input voltage terminals are electrically coupled with the input voltage, wherein the one or more reference voltage terminals are configured to receive the reference voltage; and a molded power delivery module arranged between the package substrate and the semiconductor chip and including an input conductive structure and a pair of reference conductive structures, wherein the input conductive structure is positioned between the pair of reference conductive structures, wherein the input conductive structure is coupled to the chip input voltage terminal and the package input voltage terminal, wherein each of the pair of reference conductive structures are coupled with a chip reference terminal and a package reference terminal.

In Example 44, the subject matter of Example 43 may optionally include wherein the reference conductive structures are narrower than the input conductive structure.

In Example 45, the subject matter of Examples 43 and 44 may optionally include wherein the input conductive structure is s-shaped.

In Example 46, the subject matter of Examples 43 to 45 may optionally include wherein the input conductive structure is i-shaped.

In Example 47, the subject matter of Examples 43 to 46 may optionally include wherein at least one of the pair of reference conductive structures is t-shaped.

Example 48 is a method of forming an power delivery module including: depositing a passivation layer over a chip surface, wherein the passivation layer includes a plurality of interconnect exposures to the chip surface and a plurality of conductive exposures to the chip surface; forming a plurality of vertical interconnect accesses in the plurality of interconnect exposures; forming a plurality of conductive structures in the conductive exposures; and depositing molding material around the conductive structures.

In Example 49, the subject matter of Example 48 may optionally include wherein a first conductive structure is narrower than a second conductive structure.

In Example 50, the subject matter of Examples 48 and 49 may optionally include wherein at least one of the plurality of conductive structures is s-shaped.

In Example 51, the subject matter of Examples 48 to 50 may optionally include wherein at least one of the plurality of conductive structures is i-shaped.

In Example 52, the subject matter of Examples 48 to 51 may optionally include wherein at least one of the plurality of conductive structures is t-shaped.

In Example 53, the subject matter of Examples 48 to 52 may optionally include, wherein the plurality of conductive structures and the molding material have the same height.

In Example 54, the subject matter of Examples 48 to 53 may optionally include wherein the plurality of conductive structures have a structure length that is less than a molding material length.

In Example 55, the subject matter of Examples 48 to 54 may optionally include wherein at least one of the plurality of conductive structures has a width between 150 µm and 500 µm.

In Example 56, the subject matter of Examples 48 to 55 may optionally include wherein at least one of the plurality of conductive structures has a width between 10 µm and 100 µm In Example 57, the subject matter of Examples 48 to 56 may optionally include wherein the plurality of vertical interconnects have a length between 10 µm and 50 µm.

In Example 58, the subject matter of Examples 48 to 57 may optionally include wherein the power delivery module has a height between 30 µm and 80 µm.

Example 59 is a non-transitory computer readable medium storing instructions that, when executed by one or more processors of a manufacturing device, cause the manufacturing device to perform the method of any one of Examples 48 to 58.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor chip package comprising:
   a semiconductor chip comprising a chip input voltage terminal and a chip reference voltage terminal;
   a package substrate comprising one or more package input voltage terminals and one or more package reference voltage terminals,
      wherein the one or more package input voltage terminals are configured to receive a first voltage,
      wherein the one or more package reference voltage terminals are configured to receive a second voltage; and
   a molded power delivery module arranged between the package substrate and the semiconductor chip and comprising a plurality of input conductive structures and a plurality of reference conductive structures, wherein the plurality of input conductive structures alternate between the plurality of reference conductive structures,
      wherein the plurality of input conductive structures are coupled to the chip input voltage terminal and the package input voltage terminal,
      wherein the plurality of reference conductive structures are coupled to the chip reference voltage terminal and the package reference voltage terminal, and
      wherein the semiconductor chip comprises a plurality of vertical interconnects encircling at least a portion of the molded power delivery module.

2. The semiconductor chip package of claim 1, wherein the plurality of reference conductive structures are coupled to a ground reference voltage (Vss) and the plurality of input conductive structures are coupled to a power supply voltage (Vcc).

3. The semiconductor chip package of claim 1, wherein one of the plurality of input conductive structures is s-shaped.

4. The semiconductor chip package of claim 1, wherein one of the plurality of input conductive structures is i-shaped.

5. The semiconductor chip package of claim 1, wherein one of the plurality of reference conductive structures is t-shaped.

6. The semiconductor chip package of claim 1, wherein the plurality of input conductive structures and the plurality of reference conductive structures are encased in a molding material.

7. The semiconductor chip package of claim 6, wherein the plurality of input conductive structures, the plurality of reference conductive structures, and the molding material have the same height.

8. The semiconductor chip package of claim 6, wherein the plurality of input conductive structures are positioned in between a pair of the plurality of reference conductive structures along a width of the molding material.

9. The semiconductor chip package of claim 6, wherein the plurality of input conductive structures, and the plurality of reference conductive structures have a structure length that is less than a molding material length.

10. The semiconductor chip package of claim 1, wherein the input conductive structures have a width between 150 µm and 500 µm.

11. The semiconductor chip package of claim 1, wherein the reference conductive structures have a width between 10 μm and 100 μm.

12. The semiconductor chip package of claim 1, wherein the plurality of vertical interconnects comprises a height between 10 μm and 50 μm.

13. The semiconductor chip package of claim 1, wherein power delivery module is integrated to the semiconductor chip.

14. A semiconductor chip package comprising:
- a semiconductor chip comprising a chip input voltage terminal configured to receive an input voltage and chip reference voltage terminal configured to receive a reference voltage;
- a package substrate comprising one or more package input voltage terminals and one or more package reference voltage terminals,
  - wherein the one or more package input voltage terminals are electrically coupled with the input voltage,
  - wherein the one or more package reference voltage terminals are configured to receive the reference voltage; and
- a molded power delivery module arranged between the package substrate and the semiconductor chip and comprising an input conductive structure and a pair of reference conductive structures, wherein the input conductive structure is positioned between the pair of reference conductive structures,
  - wherein the input conductive structure is coupled to the chip input voltage terminal and the package input voltage terminal,
  - wherein each of the pair of reference conductive structures are coupled with a chip reference voltage terminal and a package reference voltage terminal, and
  - wherein the semiconductor chip comprises a plurality of vertical interconnects encircling at least a portion of the molded power delivery module.

15. The semiconductor chip package of claim 14, wherein the reference conductive structures are narrower than the input conductive structure.

16. The semiconductor chip package of claim 14, wherein the input conductive structure is s-shaped.

17. The semiconductor chip package of claim 14, wherein the input conductive structure is i-shaped.

* * * * *